US010423083B2

(12) United States Patent
Harada et al.

(10) Patent No.: US 10,423,083 B2
(45) Date of Patent: Sep. 24, 2019

(54) CLEANING METHOD OF IMMERSION LIQUID, IMMERSION LIQUID CLEANING COMPOSITION, AND SUBSTRATE

(71) Applicant: JSR Corporation, Tokyo (JP)

(72) Inventors: Kentaro Harada, Sunnyvale, CA (US); Goji Wakamatsu, Sunnyvale, CA (US)

(73) Assignee: JSR Corporation, Tokyo (JP)

( * ) Notice: Subject to any disclaimer, the term of this patent is extended or adjusted under 35 U.S.C. 154(b) by 109 days.

(21) Appl. No.: 15/450,577

(22) Filed: Mar. 6, 2017

(65) Prior Publication Data

US 2017/0176878 A1 Jun. 22, 2017

Related U.S. Application Data

(62) Division of application No. 13/398,847, filed on Feb. 17, 2012, now abandoned.

(51) Int. Cl.
| | | |
|---|---|---|
| *G03F 1/60* | (2012.01) | |
| *G03F 7/00* | (2006.01) | |
| *H01L 21/02* | (2006.01) | |
| *G03F 7/20* | (2006.01) | |
| *B01D 15/00* | (2006.01) | |
| *B01J 20/26* | (2006.01) | |

(52) U.S. Cl.
CPC ......... *G03F 7/70975* (2013.01); *B01D 15/00* (2013.01); *B01J 20/26* (2013.01); *G03F 7/70341* (2013.01); *G03F 7/70925* (2013.01)

(58) Field of Classification Search
None
See application file for complete search history.

(56) References Cited

U.S. PATENT DOCUMENTS

| | | | |
|---|---|---|---|
| 5,447,998 A | 9/1995 | Grady et al. | |
| 6,166,100 A * | 12/2000 | Hiwara | C09D 11/101 106/31.6 |
| 6,258,898 B1 | 7/2001 | Rehfuss et al. | |
| 2002/0051936 A1 | 5/2002 | Harada et al. | |
| 2002/0103270 A1 * | 8/2002 | Takeuchi | C08G 59/4292 522/142 |
| 2004/0072420 A1 | 4/2004 | Enomoto | |
| 2007/0099124 A1 * | 5/2007 | Jung | G03F 7/2041 430/311 |
| 2007/0259287 A1 | 11/2007 | Sakakibara | |
| 2008/0193872 A1 | 8/2008 | Caporale et al. | |
| 2010/0068650 A1 | 3/2010 | Nishimura et al. | |
| 2010/0173249 A1 * | 7/2010 | Jung | G03F 7/2041 430/315 |
| 2010/0190104 A1 * | 7/2010 | Nakamura | G03F 7/0035 430/270.1 |
| 2010/0221659 A1 | 9/2010 | Ebata et al. | |
| 2010/0323292 A1 * | 12/2010 | Nakamura | G03F 7/0035 430/270.1 |
| 2011/0111349 A1 | 5/2011 | Wakamatsu et al. | |
| 2011/0123936 A1 * | 5/2011 | Hori | H01L 21/0273 430/324 |
| 2011/0223544 A1 * | 9/2011 | Yada | G03F 7/0035 430/324 |
| 2012/0077124 A1 * | 3/2012 | Nakahara | C08F 224/00 430/285.1 |
| 2012/0082935 A1 | 4/2012 | Kimura et al. | |

FOREIGN PATENT DOCUMENTS

| | | |
|---|---|---|
| EP | 2003148 A2 | 12/2008 |
| JP | 10-303114 | 11/1998 |
| JP | 2006-091798 | 4/2006 |
| WO | WO 2008/047678 | 4/2008 |
| WO | WO 2009/041270 | 4/2009 |

OTHER PUBLICATIONS

Specification of NIKALAC MX-750, "Sanwa Chemical web site, Electronics Materials", retrieved from http://www.sanwa-chemical.co.jp/html/english/products/p_top.html.
Specification of OXIPA,"UBE Industries, Ltd., Oxetane", retrieved from https://www.ube.com/contents/en/chemical/urethane/oxetane.html.
"Sanwa Chemical web site, Corporate outline", retrieved from http://www.sanwa-chemical.co.jp/html/english/aboutus/a_top.html.

\* cited by examiner

*Primary Examiner* — Lorna M Douyon
(74) *Attorney, Agent, or Firm* — Oblon, McClelland, Maier & Neustadt, L.L.P.

(57) ABSTRACT

A cleaning method of an immersion liquid includes supplying an immersion liquid on a surface of a cleaning substrate. The immersion liquid is to be used in a liquid immersion lithography apparatus. The cleaning substrate has a substrate and an organic film laminated on a top face side of the substrate. The immersion liquid is allowed to move on the substrate to remove contaminants from the immersion liquid.

14 Claims, No Drawings

CLEANING METHOD OF IMMERSION LIQUID, IMMERSION LIQUID CLEANING COMPOSITION, AND SUBSTRATE

CROSS-REFERENCE TO RELATED APPLICATIONS

The present application is a divisional application of U.S. patent application Ser. No. 13/398,847, filed Feb. 17, 2012, now abandoned, the contents of which are incorporated herein by reference in their entirety.

BACKGROUND OF THE INVENTION

Field of the Invention

The present invention relates to a cleaning method of an immersion liquid, an immersion liquid cleaning composition, and a substrate.

Discussion of the Background

In manufacture of semiconductor devices, microfabrication by lithography carried out using a chemically amplified resist composition has been conventionally carried out. A pattern formation method used in the microfabrication generally includes: a step of forming a resist film on a substrate; a step of exposure by irradiating the resist film with an actinic ray such as ultraviolet ray through a mask; a step of development of the exposed resist film; and a step of etching using the obtained resist pattern as a protective film.

In recent years, enhanced integration of semiconductor devices has progressed, and thus further miniaturization of resist patterns in lithography has been demanded. Accordingly, as a method for forming a resist pattern that meets such demands, a liquid immersion lithography process in which a liquid immersion medium (immersion liquid) such as e.g., ultra pure water or a fluorine based inert liquid is filled between an exposure lens and the resist film to carry out the exposure (see, Japanese Unexamined Patent Application, Publication No. H10-303114) has been increasingly utilized. The liquid immersion lithography process is advantageous in that the numerical aperture (NA) of the lens can be increased, whereas the focal depth is less likely to be decreased even if NA is increased, and a high resolving ability can be attained.

Furthermore, in techniques for improving the liquid immersion lithography process, providing a liquid immersion upper layer film on the resist film for the purpose of suppressing elution of the resist film components into the immersion liquid, and the like, is proposed (see Japanese Unexamined Patent Application, Publication No. 2006-91798, and PCT International Publication No. 2008/47678 and 2009/41270).

However, also when the liquid immersion upper layer film is provided, the immersion liquid may be contaminated with slight amounts of resist film components and liquid immersion upper layer film components, or with dust present in the liquid immersion lithography apparatus during a formation step of a resist pattern carried out using a liquid immersion lithography process. Thus, due to the contaminants mixed in the immersion liquid, the exposure may be defective, and the resolving ability of the formed resist pattern may be deteriorated; therefore, development of a cleaning method of an immersion liquid, a composition for cleaning an immersion liquid, and a substrate which enable an immersion liquid containing such contaminants to be readily and efficiently cleaned to permit reuse has been desired.

SUMMARY OF THE INVENTION

According to one aspect of the present invention, a cleaning method of an immersion liquid includes supplying an immersion liquid on a surface of a cleaning substrate. The immersion liquid is to be used in a liquid immersion lithography apparatus. The cleaning substrate has a substrate and an organic film laminated on a top face side of the substrate. The immersion liquid is allowed to move on the substrate to remove contaminants from the immersion liquid.

According to another aspect of the present invention, an immersion liquid cleaning composition includes a first polymer, a compound component and a solvent. The compound component consists of at least one compound selected from the set consisting of a first compound having at least two groups represented by a following formula (1), a second compound having a group represented by a following formula (2) and a third compound having a group represented by a following formula (3).

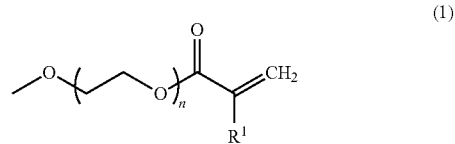

In the formula (1), $R^1$ represents a hydrogen atom or a methyl group, and n is an integer of 0 to 10.

In the formula (2), each of $R^2$ and $R^3$ each independently represents a hydrogen atom or a group represented by a following formula (ii), and at least either one of $R^2$ and $R^3$ represents a group represented by the following formula (ii).

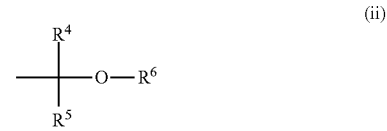

In the formula (ii), each of $R^4$ and $R^5$ each independently represents a hydrogen atom, an alkyl group having 1 to 6 carbon atoms or an alkoxyalkyl group having 1 to 6 carbon atoms, and, optionally, $R^4$ and $R^5$ bind with each other to form a ring structure together with the carbon atom to which $R^4$ and $R^5$ each bind, and $R^6$ represents a hydrogen atom or an alkyl group having 1 to 6 carbon atoms.

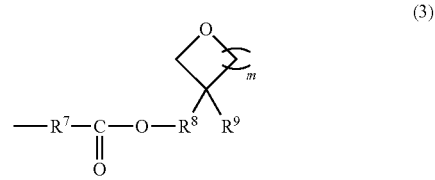

In the formula (3), each of $R^7$ and $R^8$ independently represents a single bond, a methylene group, an alkylene group having 2 to 20 carbon atoms or a bivalent cyclic hydrocarbon group having 3 to 20 carbon atoms, $R^9$ represents an alkyl group having 1 to 20 carbon atoms or a monovalent cyclic hydrocarbon group having 3 to 20 carbon atoms, and m is 0 or 1.

According to further aspect of the present invention, a cleaning substrate includes a substrate and an organic film. The organic film is laminated on a top face side of the substrate and made from the immersion liquid cleaning composition.

DESCRIPTION OF THE EMBODIMENTS

An embodiment of the present invention provides a cleaning method of an immersion liquid for use in a liquid immersion lithography apparatus, the method including a contaminant removing step of removing contaminants by supplying an immersion liquid on the surface of a substrate having an organic film laminated on the top face side thereof, and allowing the immersion liquid to move on the substrate.

By using the cleaning method of an immersion liquid, the immersion liquid containing contaminants immixed in the course of a formation process of a resist pattern carried out using a liquid immersion lithography process can be readily and efficiently cleaned to permit reuse.

A composition used in forming the organic film (hereinafter, may be also referred to merely as "composition") contains (A) a polymer, (B) a compound component, and (C) a solvent, in which the compound component (B) includes preferably at least one compound selected from the set consisting of (I) a compound having at least two groups represented by the following formula (1), (II) a compound having a group represented by the following formula (2), and (III) a compound having a group represented by the following formula (3):

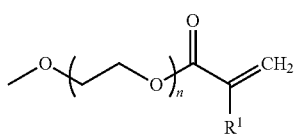

(1)

in the formula (1), $R^1$ represents a hydrogen atom or a methyl group; and n is an integer of 0 to 10;

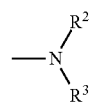

(2)

in the formula (2), $R^2$ and $R^3$ each independently represents a hydrogen atom or a group represented by the following formula (ii), and at least either one of $R^2$ and $R^3$ represents a group represented by the following formula (ii):

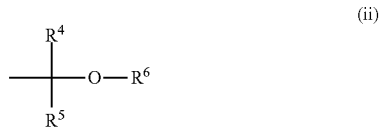

(ii)

in the formula (ii), $R^4$ and $R^5$ each independently represents a hydrogen atom, an alkyl group having 1 to 6 carbon atoms or an alkoxyalkyl group having 1 to 6 carbon atoms; and $R^4$ and $R^5$ may bind with each other to form a ring structure together with a carbon atom to which they each bind; and $R^6$ represents a hydrogen atom or an alkyl group having 1 to 6 carbon atoms;

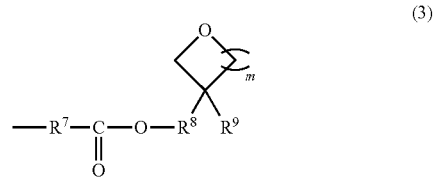

(3)

in the formula (3), $R^7$ and $R^8$ each independently represents a single bond, a methylene group, an alkylene group having 2 to 20 carbon atoms or a bivalent cyclic hydrocarbon group having 3 to 20 carbon atoms; $R^9$ represents an alkyl group having 1 to 20 carbon atoms or a monovalent cyclic hydrocarbon group having 3 to 20 carbon atoms; and m is 0 or 1.

Owing to the composition containing the compound component (B) in addition to the polymer (A) and the solvent (C), the organic film can be strengthened by a crosslinking reaction of the compound component (B) with the crosslinkable group. As a result, the organic film can certainly absorb the contaminants, whereby the immersion liquid can be efficiently cleaned.

The compound component (B) more preferably includes more preferably at least two compounds selected from the set consisting of the compound (I), the compound (II) and the compound (III). The compound component (B) including the aforementioned particular compounds enables the organic film to be further strengthened, whereby the immersion liquid can be more efficiently cleaned.

The polymer (A) preferably has a structural unit (I) represented by the following formula (4):

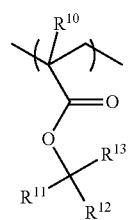

(4)

in the formula (4), $R^{10}$ represents a hydrogen atom, a methyl group or a trifluoromethyl group; $R^{11}$, $R^{12}$ and $R^{13}$ each independently represents an alkyl group having 1 to 20 carbon atoms or a monovalent alicyclic hydrocarbon group having 3 to 20 carbon atoms, and a part or all of hydrogen atoms of the alkyl group and the alicyclic hydrocarbon group may be substituted; and $R^{11}$ and $R^{12}$ may bind with each other to form a ring structure together with a carbon atom to which they each bind.

Due to the polymer (A) having the aforementioned particular structural unit, the immersion liquid can be still more efficiently cleaned.

It is preferred that the composition further contains (D) a polymer having at least one fluorine atom (hereinafter, may be also referred to as "(D) polymer"). When the composition further contains the polymer (D), water repellency of the organic film against the immersion liquid can be improved, and thus the immersion liquid can be smoothly moved on the organic film.

The polymer (D) preferably has at least one structural unit (II) selected from the set consisting of structural units each represented by the following formulae (5) and (6):

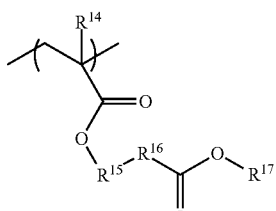

(5)

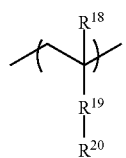

(6)

in the formula (5), $R^{14}$ represents a hydrogen atom, a methyl group or a trifluoromethyl group; $R^{15}$ represents a single bond, a methylene group, an alkylene group having 2 to 20 carbon atoms, a bivalent alicyclic hydrocarbon group having 3 to 20 carbon atoms, a bivalent aromatic hydrocarbon group having 6 to 20 carbon atoms, or a combined bivalent group of these, and a part or all of hydrogen atoms of the methylene group, the alkylene group, the alicyclic hydrocarbon group and the aromatic hydrocarbon group may be substituted; $R^{16}$ represents a fluorinated methylene group or a fluorinate alkylene group having 2 to 20 carbon atoms; and $R^{17}$ represents a hydrogen atom or a monovalent organic group, whereas in the formula (6), represents a hydrogen atom, a methyl group or a trifluoromethyl group; $R^{19}$ represents a bivalent linking group; and $R^{20}$ represents a fluorinated alkyl group having 1 to 20 carbon atoms or a monovalent fluorinated alicyclic hydrocarbon group having 3 to 20 carbon atoms.

The polymer (D) having the aforementioned particular structural unit (II) enables the water repellency of the organic film against the immersion liquid to be still further improved, and the immersion liquid to be cleaned can be more smoothly moved, whereby more efficient cleaning can be executed.

A composition for cleaning an immersion liquid of the embodiment of the present invention contains
(A) a polymer,
(B) a compound component, and
(C) a solvent,
in which the compound component (B) includes at least one compound selected from the set consisting of (I) a compound having at least two groups represented by the following formula (1), (II) a compound having a group represented by the following formula (2) and (III) a compound having a group represented by the following formula (3):

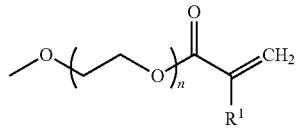

(1)

in the formula (1), $R^1$ represents a hydrogen atom or a methyl group; and n is an integer of 0 to 10;

(2)

in the formula (2), $R^2$ and $R^3$ each independently represents a hydrogen atom or a group represented by the following formula (ii), and at least either one of $R^2$ and $R^3$ represents a group represented by the following formula (ii):

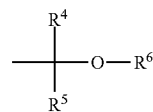

(ii)

in the formula (ii), $R^4$ and $R^5$ each independently represents a hydrogen atom, an alkyl group having 1 to 6 carbon atoms or an alkoxyalkyl group having 1 to 6 carbon atoms, and $R^4$ and $R^5$ may bind with each other to form a ring structure together with a carbon atom to which they each bind; and $R^6$ represents a hydrogen atom or an alkyl group having 1 to 6 carbon atoms;

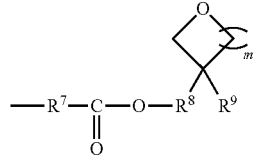

(3)

in the formula (3), $R^7$ and $R^8$ each independently represents a single bond, a methylene group, an alkylene group having 2 to 20 carbon atoms or a bivalent cyclic hydrocarbon group having 3 to 20 carbon atoms; $R^9$ represents an alkyl group having 1 to 20 carbon atoms or a monovalent cyclic hydrocarbon group having 3 to 20 carbon atoms; and m is 0 or 1.

The composition for cleaning an immersion liquid can be used in a method for readily and efficiently cleaning the immersion liquid containing contaminants immixed in the course of a formation process of a resist pattern carried out using a liquid immersion lithography process to enable reuse of the immersion liquid, and can be suitably used for example, in a cleaning method of the immersion liquid. According to the composition for cleaning an immersion liquid, since the compound component (B) in addition to the polymer (A) and the solvent (C) is contained, for example, in a method of forming an organic film and cleaning the immersion liquid with the composition for cleaning an immersion liquid, a rigid organic film can be formed owing to a crosslinking reaction between the compound component (B) and the crosslinkable group.

The compound component (B) more preferably includes at least two compounds selected from the set consisting of the compound (I), the compound (II) and the compound (III). The compound component (B) including the aforementioned particular compounds enables the organic film to be further strengthened, whereby the immersion liquid can be more efficiently cleaned.

The polymer (A) preferably has a structural unit (I) represented by the following formula (4):

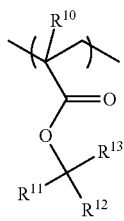

(4)

in the formula (4), $R^{10}$ represents a hydrogen atom, a methyl group or a trifluoromethyl group; $R^{11}$, $R^{12}$ and $R^{13}$ each independently represents an alkyl group having 1 to 20 carbon atoms or a monovalent alicyclic hydrocarbon group having 3 to 20 carbon atoms, and a part or all of hydrogen atoms of the alkyl group and the alicyclic hydrocarbon group may be substituted; and $R^{11}$ and $R^{12}$ may bind with each other to form a ring structure together with a carbon atom to which they each bind.

Due to the polymer (A) having the aforementioned particular structural unit, the immersion liquid can be still more efficiently cleaned.

It is preferred that the composition for cleaning an immersion liquid further contains the polymer (D). When the composition for cleaning an immersion liquid further contains the polymer (D), water repellency of the organic film against the immersion liquid can be improved, and thus the immersion liquid can be smoothly moved on the organic film.

The polymer (D) preferably has at least one structural unit (II) selected from the set consisting of structural units each represented by the following formulae (5) and (6):

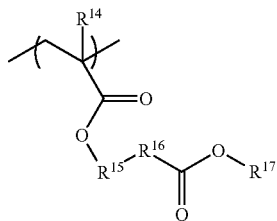

(5)

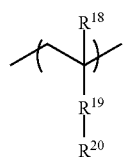

(6)

in the formula (5), $R^{14}$ represents a hydrogen atom, a methyl group or a trifluoromethyl group; $R^{15}$ represents a single bond, a methylene group, an alkylene group having 2 to 20 carbon atoms, a bivalent alicyclic hydrocarbon group having 3 to 20 carbon atoms, a bivalent aromatic hydrocarbon group having 6 to 20 carbon atoms, or a combined bivalent group of these, and a part or all of hydrogen atoms of the methylene group, the alkylene group, the alicyclic hydrocarbon group and the aromatic hydrocarbon group may be substituted; $R^{16}$ represents a fluorinated methylene group or a fluorinate alkylene group having 2 to 20 carbon atoms; and $R^{17}$ represents a hydrogen atom or a monovalent organic group, whereas in the formula (6), $R^{18}$ represents a hydrogen atom, a methyl group or a trifluoromethyl group; $R^{19}$ represents a bivalent linking group; and $R^{20}$ represents a fluorinated alkyl group having 1 to 20 carbon atoms or a monovalent fluorinated alicyclic hydrocarbon group having 3 to 20 carbon atoms.

The polymer (D) having the aforementioned particular structural unit (II) enables the water repellency of the organic film against the immersion liquid to be still further improved, and the immersion liquid to be cleaned can be more smoothly moved, whereby more efficient cleaning can be executed.

The substrate of the embodiment of the present invention has a laminated organic film formed from the composition for cleaning an immersion liquid.

Since the aforementioned particular composition for cleaning an immersion liquid is used, the substrate has a rigid organic film by way of a crosslinking reaction of the compound component (B) with a crosslinkable group. As a result, the substrate can be suitably used as a substrate used in, for example, cleaning the immersion liquid.

According to the cleaning method of an immersion liquid, the composition for cleaning an immersion liquid, and the substrate of the embodiment of the present invention, an immersion liquid containing contaminants immixed in the course of a formation process of a resist pattern carried out using a liquid immersion lithography process can be readily and efficiently cleaned and then reused. As a result, defects resulting from exposure in the exposure step using a liquid immersion lithography process can be overcome, and thus formation of a finer resist pattern that is superior in resolving ability is enabled. The embodiments will now be described.

<Cleaning Method of Immersion Liquid>

The cleaning method of an immersion liquid of the embodiment of the present invention is a cleaning method of an immersion liquid for use in a liquid immersion lithography apparatus, the method including a contaminant removing step of removing contaminants by supplying an immersion liquid on the surface of a substrate having an organic film laminated on the top face side thereof, and allowing the immersion liquid to move on the substrate. The contaminant removing step is described in detail below.

[Contaminant Removing Step]

In this step, a substrate having an organic film laminated on the top face side thereof is used, and the step is carried out by supplying an immersion liquid on the surface of the substrate, and allowing the immersion liquid to move on the substrate. Due to this contaminant removing step included in the cleaning method of an immersion liquid, the immersion liquid containing contaminants immixed in the course of a formation process of a resist pattern carried out using a liquid immersion lithography process can be readily and efficiently cleaned and reuse thereof is enabled.

The immersion liquid is in general, a liquid having a refractive index higher than inert gas such as air and nitrogen, and, for example, pure water, ultra pure water, fluorine-containing inert liquid, or the like may be included.

The base that serves as a substrate of the organic film may be, for example, a wafer coated with a metal film of silicon, aluminum or the like, an insulating film of silicon oxide, silicon nitride, silicon oxynitride, polysiloxane or the like, a low dielectric insulating film such as Black Diamond (manufactured by Applied Materials, Inc., (AMAT)), SiLK™ (manufactured by Dow Chemical Co.,), LKD5109 (manufactured by JSR Corp.), all commercially available products, and the like.

Of these, a wafer coated with a silicon film (hereinafter, may be also referred to as "silicon wafer") is preferred. In addition, for preventing back contamination from the substrate into the immersion liquid of the contaminants, the substrate is preferably as clean as possible.

In the contaminant removing step, the immersion liquid containing the contaminants is first supplied on the surface of the substrate.

Subsequently, the immersion liquid supplied on the surface of the substrate is moved on the substrate.

The process for allowing the immersion liquid to be moved is not particularly limited, but a liquid contact member is brought into contact with the top face of the immersion liquid, and the immersion liquid may be allowed to move on the substrate according to the movement of the liquid contact member using the adhesive force between the liquid contact member and the immersion liquid.

In this step, since the contaminants that reached the surface of the substrate by way of diffusive motion are absorbed on the surface of the substrate in the immersion liquid, the amount of the contaminants included in the immersion liquid is lowered over time, and concomitantly the contaminants can be efficiently removed by way of the movement of the immersion liquid.

The liquid contact member may be, for example, an exposure lens of well-known liquid immersion lithography apparatuses, or the like.

Although the contaminant removing step may be carried out outside the liquid immersion lithography apparatus, it is preferably carried out in the liquid immersion lithography apparatus. By carrying out this step in the liquid immersion lithography apparatus, exposure lens can be used as the liquid contact member, and the immersion liquid can be readily moved by the same method as that for scabbing of the exposure lens in exposing the resist film by lithography.

Then, after carrying out the contaminant removing step, the cleaned immersion liquid is usually recovered, and can be reused again in the liquid immersion lithography apparatus.

Although the organic film is not particularly limited as long as it is formed from an organic material, is preferably formed from the composition described below. By using the particular composition, a crosslinking reaction with the crosslinkable group enables the organic film to be strengthened.

The aforementioned organic film may be a resist film. When the organic film is a resist film, the substrate having a resist film formed in lithography can be diverted as a dummy wafer, and thus the cleaning method of an immersion liquid can be conveniently performed.

<Composition Used for Formation of Organic Film>

A composition suitably used for forming the organic film contains, for example, a polymer (A), a compound component (B) and a solvent (C). Also, the composition may contain a polymer (D). Furthermore, the composition may contain other component within a range that does not deteriorate the advantageous effects of the invention. Each component is explained in detail below.

<(A) Polymer>

The polymer (A) is a main component that constitutes the organic film. Although the polymer (A) is not particularly limited, a polymer having the structural unit (I) represented by the above formula (4) is preferred. The polymer (A) having the aforementioned particular structural unit serves in enabling the immersion liquid to be efficiently cleaned. It should be noted that the polymer (A) may have two or more types of the structural unit (I).

In the above formula (4), $R^{10}$ represents a hydrogen atom, a methyl group or a trifluoromethyl group; $R^{11}$, $R^{12}$ and $R^{13}$ each independently represents an alkyl group having 1 to 20 carbon atoms or a monovalent alicyclic hydrocarbon group having 3 to 20 carbon atoms, and a part or all of hydrogen atoms of the alkyl group and the alicyclic hydrocarbon group may be substituted; and $R^{11}$ and $R^{12}$ may bind with each other to form a ring structure together with a carbon atom to which they each bind.

Examples of the an alkyl group having 1 to 20 carbon atoms represented by $R^{11}$, $R^{12}$ and $R^{13}$ include linear alkyl groups such as a methyl group, an ethyl group, a n-propyl group and a n-butyl group; branched alkyl groups such as an i-propyl group, an i-butyl group, a sec-butyl group and a t-butyl group, and the like. Of these, a methyl group, and an ethyl group are preferred.

Examples of the monovalent alicyclic hydrocarbon group having 3 to 20 carbon atoms represented by $R^{11}$, $R^{12}$ and $R^{13}$ include monocyclic saturated hydrocarbon groups such as a cyclopropyl group, a cyclobutyl group, a cyclopentyl group, a cyclohexyl group, a cycloheptyl group, a cyclooctyl group, a cyclodecyl group, a methylcyclohexyl group and an ethylcyclohexyl group; monocyclic unsaturated hydrocarbon groups such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group and cyclodecadiene; polycyclic saturated hydrocarbon groups such as a bicyclo[2.2.1]heptyl group, a bicyclo[2.2.2]octyl group, a tricyclo[5.2.1.0$^{2,6}$]decyl group, a tricyclo[3.3.1.1$^{3,7}$]decyl group, a tetracyclo[6.2.1.1$^{3,6}$.0$^{2,7}$]dodecyl group, a norbornyl group and an adamantyl group, and the like.

Examples of the group which may substitute for hydrogen atom(s) in the alkyl group and the alicyclic hydrocarbon group represented by $R^{11}$, $R^{12}$ and $R^{13}$ include a hydroxyl group; a carboxyl group; an oxo group; hydroxyalkyl groups having 1 to 4 carbon atoms such as a hydroxymethyl group, a 1-hydroxyethyl group, a 2-hydroxyethyl group, a 1-hydroxypropyl group, a 2-hydroxypropyl group, a 3-hydroxypropyl group, a 1-hydroxybutyl group, a 2-hydroxybutyl group, a 3-hydroxybutyl group and a 4-hydroxybutyl group; alkoxyl groups having 1 to 4 carbon atoms such as a methoxy group, an ethoxy group, a n-propoxy group, an i-propoxy group, a n-butoxy group, a 2-methylpropoxy group, a 1-methylpropoxy group and a t-butoxy group; a cyano group; cyanoalkyl groups having 2 to 5 carbon atoms such as a cyanomethyl group, a 2-cyanoethyl group, a 3-cyanopropyl group and a 4-cyanobutyl group, and the like. Of these, a hydroxyl group, a carboxyl group, a hydroxymethyl group, a cyano group, and a cyanomethyl group are preferred.

<(B) Compound Component>

The compound component (B) reacts with the polymer (A) or (D) a polymer described later by way of an action of an acid or heat, or reacts between molecules of the compound component (B) to harden the organic film.

This compound component (B) includes at least one compound selected from the set consisting of the compound (I) having at least two groups represented by the above formula (1), the compound (II) having the group represented by the above formula (2) and the compound (III) having the group represented by the above formula (3), and preferably includes at least two compounds selected therefrom. When the compound component (B) includes the aforementioned particular compound(s), a crosslinking reaction between the compound component (B) and a crosslinkable group enables the organic film to be strengthened. Each compound may be produced using a well-known technique, and a commercially available product may be used. It is to be noted that each compound may be used either only one or two or more types may be used in combination. Each compound is described in detail below.

<Compound (I)>

The compound (I) has at least two groups represented by the above formula (1). In the above formula (1), $R^1$ represents a hydrogen atom or a methyl group; and n is an integer of 0 to 10.

The compound (I) is preferably a compound represented by the following formula (1-1) or (1-2).

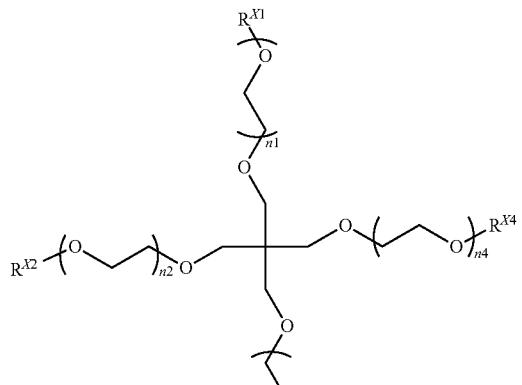

(1-1)

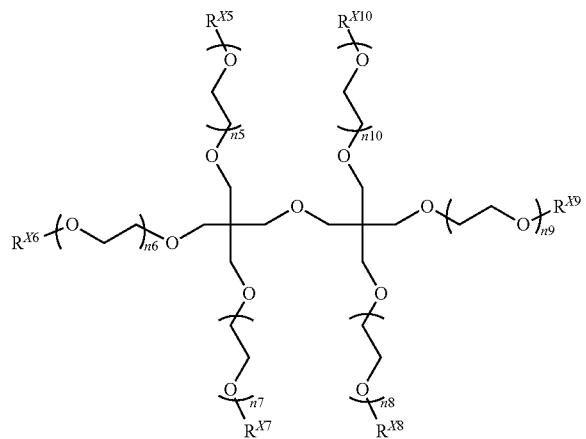

(1-2)

In the above formula (1-1),

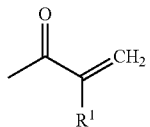

(i)

in the above formula (i), $R^1$ has the same meaning as that in the above formula (1).

Examples of compound (I) include pentaerythritol triacrylate, pentaerythritol tetraacrylate, dipentaerythritol hexaacrylate, and the like.

Examples of commercially available products of the compound (I) include KAYARAD T-1420 (T), KAYARAD RP-1040, KAYARAD DPHA, KAYARAD DPEA-12, KAYARAD DPHA-2C, KAYARAD D-310 and KAYARAD D-330 (all manufactured by Nippon Kayaku Co., Ltd.), NKester ATM-2.4E, NKester ATM-4E, NKester ATM-35E and NKester ATM-4P (all manufactured by Shin Nakamura Chemical Co., Ltd.), M-309, M-310, M-321, M-350, M-360, M-370, M-313, M-315, M-327, M-306, M-305, M-451, M-450, M-408, M-203S, M-208, M-211B, M-215, M-220, M-225, M-270 and M-240 (all manufactured by Toa Gosei Co., Ltd.), and the like.

<Compound (II)>

The compound (II) has the group represented by the above formula (2). In the above formula (2), $R^2$ and $R^3$ each independently represents a hydrogen atom or the group represented by the above formula (ii), and at least either one of $R^2$ and $R^3$ is the group represented by the above formula (ii).

In the above formula (ii), $R^4$ and $R^5$ each independently represents a hydrogen atom, an alkyl group having 1 to 6 carbon atoms or an alkoxyalkyl group having 1 to 6 carbon atoms, and $R^4$ and $R^5$ may bind with each other to form a ring structure together with a carbon atom to which they each bind; and $R^6$ represents a hydrogen atom or an alkyl group having 1 to 6 carbon atoms.

Examples of the alkyl group having 1 to 6 carbon atoms represented by the aforementioned $R^4$, $R^5$ and $R^6$ include linear alkyl groups such as a methyl group, an ethyl group, a n-propyl group and a n-butyl group; branched alkyl groups such as an i-propyl group, an i-butyl group, a sec-butyl group and a t-butyl group, and the like.

Examples of the alkoxyalkyl group having 1 to 6 carbon atoms represented by $R^4$ and $R^5$ include a methoxymethyl group, a methoxyethyl group, an ethoxymethyl group, an ethoxyethyl group, a propoxymethyl group, a propoxyethyl group, and the like.

The compound (II) is preferably a compound represented by the following formula (2-1):

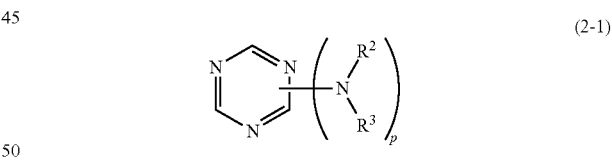

(2-1)

In the above formula (2-1), $R^2$ and $R^3$ have the same meaning as those in the above formula (2); and p is an integer of 1 to 3.

Examples of the compound (II) include nitrogen-containing compounds such as hexamethoxymethylated melamine, hexabutoxymethylated melamine, tetramethoxymethylated glycoluril and tetrabutoxymethylated glycoluril, and the like.

Furthermore, examples of the commercially available product of the compound (II) include CYMEL 300, CYMEL 301, CYMEL 303, CYMEL 350, CYMEL 232, CYMEL 235, CYMEL 236, CYMEL 238, CYMEL 266, CYMEL 267, CYMEL 285, CYMEL 1123, CYMEL 1123-10, CYMEL 1170, CYMEL 370, CYMEL 771, CYMEL 272, CYMEL 1172, CYMEL 325, CYMEL 327, CYMEL 703, CYMEL 712, CYMEL 254, CYMEL 253, CYMEL 212, CYMEL 1128, CYMEL 701, CYMEL 202, CYMEL 207 (all manufactured by Cytec Industries Inc.), Nikalac MW 30M, Nikalac MW-30, Nikalac MW 22, Nikalac MW 24X, Nikalac MS-21, Nikalac MS-11, Nikalac MS-001, Nikalac MX-002, Nikalac MX-730, Nikalac MX-750, Nikalac MX-708, Nikalac MX-706, Nikalac MX-042, Nikalac MX-035, Nikalac MX-45, Nikalac MX-410, Nikalac MX-302, Nikalac MX-202, Nikalac SM-651, Nikalac SM-652, Nikalac SM-653, Nikalac SM-551, Nikalac SM-451, Nikalac SB-401, Nikalac SB-355, Nikalac SB-303, Nikalac SB-301, Nikalac SB-255, Nikalac SB-203, Nikalac SB-201, Nikalac BX-4000, Nikalac BX-37, Nikalac BX-55H, Nikalac BL-60 (all manufactured by Nippon Carbide Industries Co., Inc.), and the like. Of these, CYMEL 325, CYMEL 327, CYMEL 703, CYMEL 712, CYMEL 254, CYMEL 253, CYMEL 212, CYMEL 1128, CYMEL 701, CYMEL 202, CYMEL 207, and Nikalac MX-750 are preferred.

<Compound (III)>

The compound (III) has the group represented by the above formula (3). In the above formula (3), $R^7$ and $R^8$ each independently represents a single bond, a methylene group, an alkylene group having 2 to 20 carbon atoms or a bivalent cyclic hydrocarbon group having 3 to 20 carbon atoms; $R^9$ represents an alkyl group having 1 to 20 carbon atoms or a monovalent cyclic hydrocarbon group having 3 to 20 carbon atoms; and m is 0 or 1.

The alkylene group having 2 to 20 carbon atoms represented by $R^7$ and $R^8$ may be either linear or branched, and examples thereof include a methanediyl group, an ethanediyl group, a propanediyl group, a butanediyl group, a pentanediyl group, a hexanediyl group, and the like.

Exemplary bivalent cyclic hydrocarbon group having 3 to 20 carbon atoms represented by $R^7$ and $R^8$ may include bivalent alicyclic hydrocarbon groups having 3 to 20 carbon atoms, bivalent aromatic hydrocarbon group having 6 to 20 carbon atoms, and the like.

Examples of the bivalent alicyclic hydrocarbon group having 3 to 20 carbon atoms include monocyclic saturated hydrocarbon groups such as a cyclopropanediyl group, a cyclobutanediyl group and a cyclopentanediyl group; monocyclic unsaturated hydrocarbon groups such as a cyclobutenediyl group, a cyclopentenediyl group and a cyclohexenediyl group; polycyclic saturated hydrocarbon groups such as a bicyclo[2.2.1]heptanediyl group, a bicyclo[2.2.2]octanediyl group and a tricyclo[5.2.1.0$^{2,6}$]decanediyl group; polycyclic unsaturated hydrocarbon groups such as a bicyclo[2.2.1]heptenediyl group, a bicyclo[2.2.2]octenediyl group and a tricyclo[5.2.1.0$^{2,6}$]decenediyl group, and the like.

Examples of the bivalent aromatic hydrocarbon group having 6 to 20 carbon atoms include a phenylene group, a biphenylene group, a terphenylene group, a benzylene group, a phenyleneethylene group, a phenylenecyclohexylene group, a naphthylene group, and the like.

As the alkyl group having 1 to 20 carbon atoms represented by $R^9$, any group exemplified in connection with $R^{11}$, $R^{12}$ and $R^{13}$ may be employed.

Examples of the monovalent cyclic hydrocarbon group having 3 to 20 carbon atoms represented by $R^9$ include a phenyl group, a biphenyl group, a terphenyl group, a benzyl group, a naphthyl group, and the like.

The compound (III) is preferably a compound represented by the following formula (3-1):

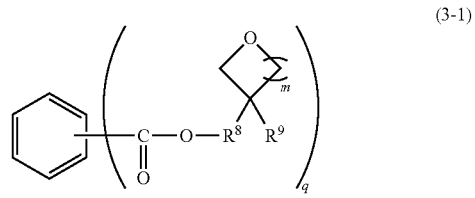

(3-1)

In the above formula (3-1), $R^8$, $R^9$ and m have the same meaning as those in the above formula (3); and q is an integer of 1 to 3.

Examples of the compound (III) include 1,6-hexanediol diglycidyl ether, dipentaerythritolhexakis(3-ethyl-3-oxetanylmethyl)ether, and the like.

Furthermore, examples of the commercially available product of the compound (III) include ARONE OXETANE OXT-101, ARONE OXETANE OXT-121 and ARONE OXETANE OXT-221 (all manufactured by Toa Gosei Co., Ltd.), OXMA, OXTP, OXBP and OXIPA (all manufactured by Ube Industries, Ltd.) and the like. Of these, OXIPA is preferred.

The content of the compound component (B) is preferably no less than 1 part by mass and no greater than 100 parts by mass, and more preferably no less than 1 part by mass and no greater than 50 parts by mass with respect to 100 parts by mass of the polymer (A). When the content is less than 1 part by mass, the crosslinking reaction of the organic film may be insufficient, and thus the immersion liquid may be contaminated resulting from detachment of the film. To the contrary, when the content exceeds 100 parts by mass, unreacted compound component (B) may be included in the immersion liquid, whereby the immersion liquid may be contaminated.

<(C) Solvent>

The solvent (C) which may be suitably used can uniformly dissolve or disperse each component, and does not react with each component. It should be noted that the solvent (C) used may be of one type, or a combination of two or more types.

Examples of the solvent (C) include ketones, propylene glycol monoalkyl ether acetates, 2-hydroxypropionic acid alkyls, 3-alkoxypropionic acid alkyls, γ-butyrolactone, and the like.

Examples of the ketones include methyl ethyl ketone, methyl isobutyl ketone, 2-heptanone, cyclohexanone, 4-hydroxy-4-methyl-2-pentanone, and the like.

Examples of the propylene glycol monoalkyl ether acetates include propylene glycol monomethyl ether acetate, propylene glycol monoethyl ether acetate, propylene glycol monopropyl ether acetate, propylene glycol monobutyl ether acetate, and the like.

Examples of the 2-hydroxypropionic acid alkyls include methyl 2-hydroxypropionate, ethyl 2-hydroxypropionate, propyl 2-hydroxypropionate, and the like.

Examples of the 3-alkoxypropionic acid alkyls include methyl 3-methoxypropionate, ethyl 3-methoxypropionate, methyl 3-ethoxypropionate, ethyl 3-ethoxypropionate, and the like.

Among these, propylene glycol monomethyl ether acetate, 2-heptanone, and cyclohexanone are preferred.

The content of the solvent (C) should be adjusted such that the concentration of the solid content included in the composition becomes usually no less than 2% by mass and no greater than 70% by mass, suitably no less than 4% by mass and no greater than 25% by mass, and more suitably no less than 4% by mass and no greater than 10% by mass.

When a solvent other than propylene glycol monomethyl ether acetate, 2-heptanone and cyclohexanone is used in combination with any of these solvents, the content of the solvent other than propylene glycol monomethyl ether acetate, 2-heptanone and cyclohexanone is usually no greater than 50% by mass, suitably no greater than 30% by mass, and more suitably no greater than 25% by mass with respect to the total solvent.

<(D) Polymer>

The polymer (D) is a polymer having a fluorine atom. The composition may or may not contain the polymer (D). When the composition contains the polymer (D), water repellency of the organic film against the immersion liquid can be improved, and thus the immersion liquid can be smoothly moved on the substrate.

Although the polymer (D) is not particularly limited as long as it has a fluorine atom, and it preferably has at least one structural unit (II) selected from the set consisting of structural units each represented by the above formula (5) and (6). When the polymer (D) has the aforementioned particular structural unit (II), the water repellency of the organic film against the immersion liquid can be further improved, and thus the immersion liquid can be even more smoothly moved on the substrate. It is to be noted that the polymer (D) may include two or more types of the structural unit (II).

In the above formula (5), $R^{14}$ represents a hydrogen atom, a methyl group or a trifluoromethyl group; $R^{15}$ represents a single bond, a methylene group, an alkylene group having 2 to 20 carbon atoms, a bivalent alicyclic hydrocarbon group having 3 to 20 carbon atoms, a bivalent aromatic hydrocarbon group having 6 to 20 carbon atoms, or a combined bivalent group of these, and a part or all of hydrogen atoms of the methylene group, the alkylene group, the alicyclic hydrocarbon group and the aromatic hydrocarbon group may be substituted with a substituent; $R^{16}$ represents a fluorinated methylene group or a fluorinate alkylene group having 2 to 20 carbon atoms; and $R^{17}$ represents a hydrogen atom or a monovalent organic group.

In the above formula (6), $R^{18}$ represents a hydrogen atom, a methyl group or a trifluoromethyl group; $R^{19}$ represents a bivalent linking group; and $R^{20}$ represents a fluorinated alkyl group having 1 to 20 carbon atoms or a monovalent fluorinated alicyclic hydrocarbon group having 3 to 20 carbon atoms.

The alkylene group having 2 to 20 carbon atoms represented by $R^{15}$ may be either linear or branched, and examples thereof include a methanediyl group, an ethanediyl group, a propanediyl group, a butanediyl group, a pentanediyl group, a hexanediyl group, and the like.

Examples of the bivalent alicyclic hydrocarbon group having 3 to 20 carbon atoms represented by $R^{15}$ include monocyclic saturated hydrocarbon groups such as a cyclopropanediyl group, a cyclobutanediyl group and a cyclopentanediyl group; monocyclic unsaturated hydrocarbon groups such as a cyclobutenediyl group, a cyclopentenediyl group and a cyclohexenediyl group; polycyclic saturated hydrocarbon groups such as a bicyclo[2.2.1]heptanediyl group and a bicyclo[2.2.2]octanediyl group; polycyclic unsaturated hydrocarbon groups such as a bicyclo[2.2.1]heptenediyl group and a bicyclo[2.2.2]octenediyl group, and the like.

Examples of the bivalent aromatic hydrocarbon group having 6 to 20 carbon atoms represented by $R^{15}$ include a phenylene group, a biphenylene group, a terphenylene group, a benzylene group, a phenyleneethylene group, a phenylenecyclohexylene group, a naphthylene group, and the like.

Examples of the substituent for hydrogen atom(s) of the methylene group, the alkylene group, the alicyclic hydrocarbon group and the aromatic hydrocarbon group represented by $R^{15}$ include a hydroxyl group, a cyano group, a hydroxyalkyl group having 1 to 10 carbon atoms, a carboxyl group, an oxygen atom, and the like.

Examples of $R^{15}$ include groups each represented by the following formulae, and the like.

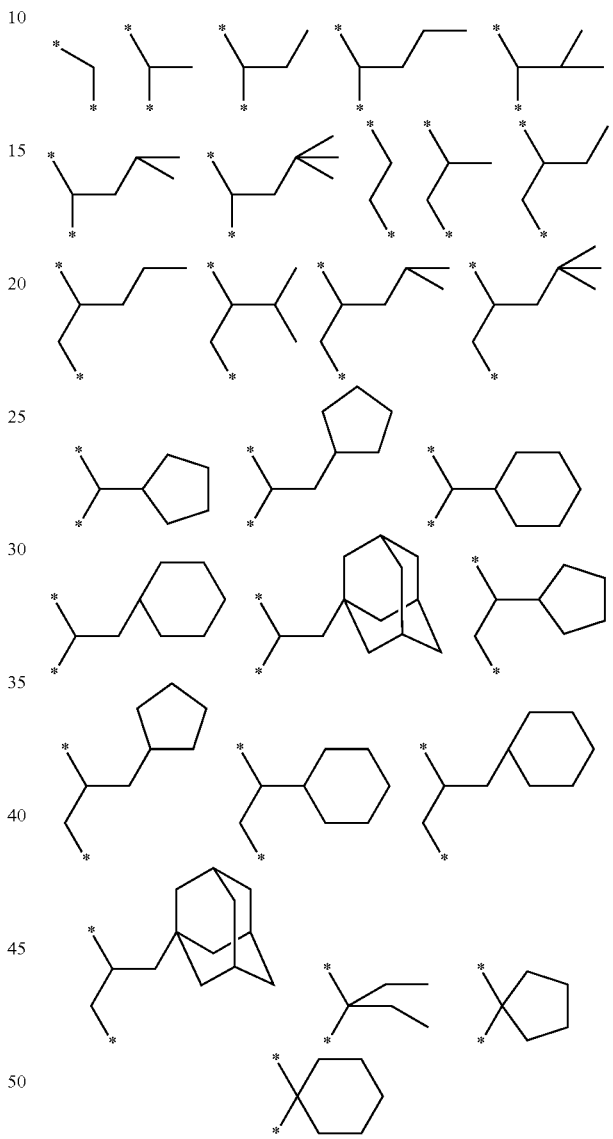

In the above formulae, "*" denotes a binding site.

The bivalent group represented by $R^{15}$ is preferably a methylene group, an ethylene group, a 1-methylethylene group, a 2-methylethylene group, a bivalent alicyclic hydrocarbon group having 4 to 20 carbon atoms or a group substituted with the aforementioned substituent.

The fluorinated alkylene group having 2 to 20 carbon atoms represented by $R^{16}$ is obtained by substituting a part or all of hydrogen atoms of the alkylene group having 2 to 20 carbon atoms with a fluorine atom.

The alkylene group having 2 to 20 carbon atoms may be either linear or branched, and examples thereof include an ethanediyl group, a propanediyl group, a butanediyl group, a pentanediyl group, a hexanediyl group, and the like.

Examples of the fluorinated methylene group or the fluorinated alkylene group having 2 to 20 carbon atoms represented by $R^{16}$ include groups each represented by the following formulae, and the like.

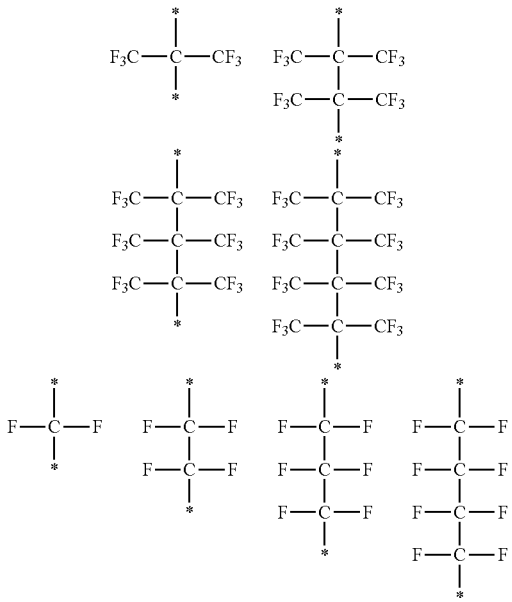

In the above formulae, "k" denotes a binding site.

Examples of the monovalent organic group represented by $R^{17}$ include acid-dissociable group, monovalent hydrocarbon groups having 1 to 20 carbon atoms (excluding acid-dissociable groups), and the like. It is to be noted that the acid-dissociable group as referred to means a group that substitutes for hydrogen atom(s) of a polar functional group such as, e.g., a hydroxyl group, a carboxyl group and the like, and is dissociated in the presence of an acid.

Examples of the acid-dissociable group include groups represented by the following formula, and the like.

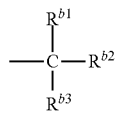

In the above formula, $R^{b1}$, $R^{b2}$ and $R^{b3}$ each independently represents an alkyl group having 1 to 20 carbon atoms or a monovalent alicyclic hydrocarbon group having 3 to 20 carbon atoms, and a part or all of hydrogen atoms of the alkyl group and the alicyclic hydrocarbon group may be substituted; $R^{b1}$ and $R^{b2}$ may bind to form a ring structure together with a carbon atom to which they each bind.

As the alkyl group having 1 to 20 carbon atoms and the monovalent alicyclic hydrocarbon group having 3 to 20 carbon atoms represented by $R^{b1}$, $R^{b2}$ and $R^{b3}$, any group exemplified in connection with $R^{11}$, $R^{12}$ and $R^{13}$ may be employed.

Examples of the group which may substitute for hydrogen atom(s) in the alkyl group and the alicyclic hydrocarbon group include linear, branched or cyclic alkyl groups having 1 to 4 carbon atoms such as a methyl group, an ethyl group, a n-propyl group, an i-propyl group, a n-butyl group, a 2-methylpropyl group, a 1-methylpropyl group and a t-butyl group, and the like.

The monomer capable of providing the structural unit represented by the above formula (5) is preferably a monomer represented by the following formulae.

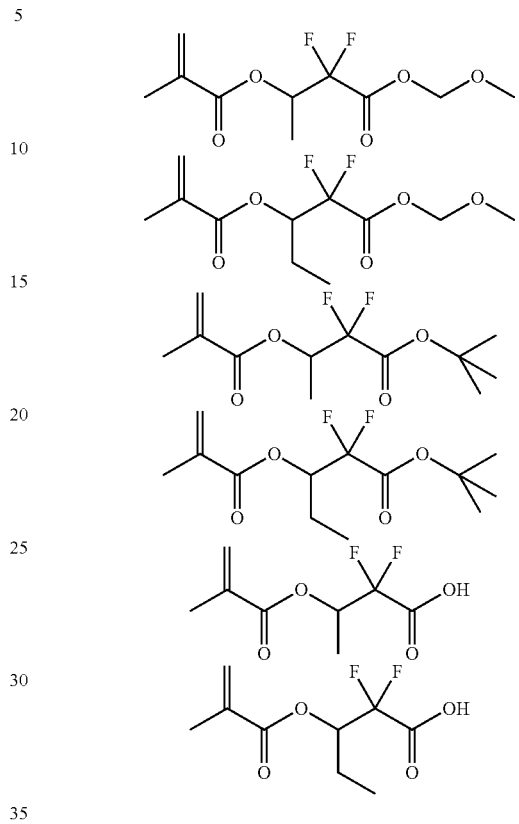

Examples of the bivalent linking group represented by $R^{19}$ include a single bond, an oxygen atom, a sulfur atom, a carbonyloxy group, an oxycarbonyl group, an amide group, a sulfonylamide group, a urethane group, and the like.

The fluorinated alkyl group having 1 to 20 carbon atoms represented by $R^{20}$ is obtained by substituting a part or all of hydrogen atoms of the alkyl group having 1 to 20 carbon atoms with a fluorine atom.

As the alkyl group having 1 to 20 carbon atoms, any group exemplified in connection with $R^{11}$, $R^{12}$ and $R^{13}$ may be employed.

The monovalent fluorinated alicyclic hydrocarbon group having 3 to 20 carbon atoms represented by $R^{20}$ is obtained by substituting a part or all of hydrogen atoms of the monovalent alicyclic hydrocarbon group having 3 to 20 carbon atoms with a fluorine atom.

As the monovalent alicyclic hydrocarbon group having 3 to 20 carbon atoms, any group exemplified in connection with $R^{11}$, $R^{12}$ and $R^{13}$ may be employed.

Examples of the monomer capable of providing the structural unit represented by the above formula (6) include trifluoromethyl (meth)acrylic ester, 2,2,2-trifluoroethyl (meth)acrylic ester, perfluoroethyl (meth)acrylic ester, perfluoron-propyl (meth)acrylic ester, perfluoroi-propyl (meth)acrylic ester, perfluoron-butyl (meth)acrylic ester, perfluoroi-butyl (meth)acrylic ester, perfluoro-t-butyl (meth)acrylic ester, 2-(1,1,1,3,3,3-hexafluoropropyl) (meth)acrylic ester, 1-(2,2,3,3,4,4,5,5-octafluoropentyl) (meth)acrylic ester, perfluorocyclohexylmethyl (meth)acrylic ester, 1-(2,2,3,3,3-pentafluoropropyl) (meth)acrylic ester, 1-(3,3,4,4,5,5,6,6,7,7,8,8,9,9,10,10,10-heptadecafluorodecyl) (meth)

acrylic ester, 1-(5-trifluoromethyl-3,3,4,4,5,6,6,6-octafluorohexyl) (meth)acrylic ester, and the like.

The content of the structural unit (II) with respect to the total structural units in the polymer (D) is usually no less than 5% by mole, more preferably no less than 10% by mole, and still more preferably no less than 15% by mole. When the content of the structural unit (II) falls within the aforementioned particular range, the water repellency of the organic film can be efficiently improved.

The content of the polymer (D) with respect to 100 parts by mass of the polymer (A) is preferably no less than 0.1 parts by mass and no greater than 20 parts by mass, and more preferably no less than 1 part by mass and no greater than 10 parts by mass. When the content of the polymer (D) falls within the aforementioned particular range, water repellency of the organic film can be efficiently improved, and thus the immersion liquid can be smoothly moved on the organic film.

<Other Components>

The composition may contain other components within a range that does not deteriorate the advantageous effects of the invention. The other component may include, for example, when the organic film is a resist film, an acid generator, an acid diffusion controlling agent, a surfactant, a sensitizer, an alicyclic additive, and the like. Each component is described in detail below.

<Acid Generator>

The acid generator is a component that generates an acid through degradation by exposure or heat. The acid generator may include, for example, an ionic compound, and the like. The acid generator used may be of one type, or a combination of two or more types.

Examples of the cation of the ionic compound include triphenylsulfonium cation, tri-1-naphthylsulfonium cation, tri-tert-butylphenylsulfonium cation, 4-fluorophenyl-diphenylsulfonium cation, di-4-fluorophenyl-phenylsulfonium cation, tri-4-fluorophenylsulfonium cation, 4-cyclohexylphenyl-diphenylsulfonium cation, 4-methanesulfonylphenyl-diphenylsulfonium cation, 4-cyclohexanesulfonyl-diphenylsulfonium cation, 1-naphthyldimethylsulfonium cation, 1-naphthyldiethylsulfonium cation, 1-(4-hydroxynaphthyl)dimethylsulfonium cation, 1-(4-methylnaphthyl)dimethylsulfonium cation, 1-(4-methylnaphthyl)diethylsulfonium cation, 1-(4-cyanonaphthyl)dimethylsulfonium cation, 1-(4-cyanonaphthyl)diethylsulfonium cation, 1-(3,5-dimethyl-4-hydroxyphenyl)tetrahydrothiophenium cation, 1-(4-methoxynaphthyl)tetrahydrothiophenium cation, 1-(4-ethoxynaphthyl)tetrahydrothiophenium cation, 1-(4-n-propoxynaphthyl)tetrahydrothiophenium cation, 1-(4-n-butoxynaphthyl)tetrahydrothiophenium cation, 2-(7-methoxynaphthyl)tetrahydrothiophenium cation, 2-(7-ethoxynaphthyl)tetrahydrothiophenium cation, 2-(7-n-propoxynaphthyl)tetrahydrothiophenium cation, 2-(7-n-butoxynaphthyl)tetrahydrothiophenium cation, and the like.

Examples of the anion of the ionic compound include trifluoromethanesulfonate anion, nonafluoro-n-butanesulfonate anion, perfluoro-n-octanesulfonate anion, 2-bicyclo[2.2.1]heptane-2-yl-1,1,2,2-tetrafluoroethanesulfonate anion, 2-bicyclo[2.2.1]heptane-2-yl-1,1-difluoroethanesulfonate anion, and the like.

The content of the acid generator when added is preferably 0.1 to 20 parts by mass, and more preferably 0.5 to 10 parts by mass with respect to 100 parts by mass of the total polymer. When the content of the acid generator falls within the aforementioned particular range, the crosslinking reaction can be efficiently promoted.

<Acid Diffusion Controlling Agent>

The acid diffusion controlling agent is a component that suppresses diffusion of an acid generated from the acid generator due to exposure in the composition. When the composition contains the acid diffusion controlling agent, storage stability of the composition can be improved. The acid diffusion controlling agent used may be of one type, or a combination of two or more types.

Examples of the acid diffusion controlling agent include (R)-(+)-1-(t-butoxycarbonyl)-2-pyrrolidinemethanol, N-t-butoxycarbonylpyrrolidine, triphenylsulfonium salicylate, and the like.

The content of the acid diffusion controlling agent when added is usually no less than 0.001 parts by mass and no greater than 15 parts by mass, preferably no less than 0.001 parts by mass and no greater than 10 parts by mass, and more preferably no less than 0.001 parts by mass and no greater than 5 parts by mass with respect to 100 parts by mass of the total polymer. When the content of the acid diffusion controlling agent falls within the aforementioned particular range, the storage stability of the composition can be efficiently improved.

<Surfactant>

The surfactant is a component that improves the coating property. When the composition contains the surfactant, nonuniform coating of the composition is reduced, and thus lamination of a uniform organic film is enabled. The surfactant used may be of one type, or a combination of two or more types.

Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate and polyethylene glycol distearate, and the like. Also, examples of the commercially available product of the surfactant include KP341 (manufactured by Shin-Etsu Chemical Co., Ltd.), Polyflow No. 75 and Polyflow No. 95 (all manufactured by Kyoeisha Chemical Co., Ltd.), EFTOP EF301, EFTOP EF303 and EFTOP EF352 (all manufactured by Tochem Products, Co., Ltd.,), Megaface® F171 and Megaface® F173 (all manufactured by Dainippon Ink And Chemicals, Incorporated), Florade FC430 and Florade FC431 (all manufactured by Sumitomo 3M Ltd.), Asahi Guard AG710, Surflon S-382, Surflon SC-101, Surflon SC-102, Surflon SC-103, and Surflon SC-104, Surflon SC-105 and Surflon SC-106 (all manufactured by Asahi Glass Co., Ltd.), and the like.

The content of the surfactant when added is usually no greater than 2 parts by mass with respect to 100 parts by mass of the total polymer. When the content of the surfactant falls within the aforementioned particular range, the coating property can be efficiently improved.

<Sensitizer>

The sensitizer is a component that accelerates production of an acid from the acid generator by way of radiation. The sensitizer used may be of one type, or a combination of two or more types.

Examples of the sensitizer include carbazoles, acetophenones, benzophenones, naphthalenes, phenols, biacetyl, eosin, rose bengal, pyrenes, anthracenes, phenothiazines, and the like.

The content of the sensitizer when added is usually no greater than 50 parts by mass with respect to 100 parts by mass of the total polymer.

<Alicyclic Additive>

The alicyclic additive is a component that improves the adhesiveness. When the composition contains the alicyclic additive, a substrate having a highly adhesive organic film laminated thereon can be obtained. The alicyclic additive used may be of one type, or a combination of two or more types.

Examples of the alicyclic additive include adamantane derivatives such as t-butyl 1-adamantane carboxylate, and the like.

The content of the alicyclic additive when added is usually no greater than 50 parts by mass, and more preferably no greater than 30 parts by mass with respect to 100 parts by mass of the total polymer.

<Synthesis Method of Each Polymer>

In the method of synthesizing the polymer (A) and the polymer (D), for example, a monomer corresponding to each predetermined structural unit is polymerized using a polymerization initiator, in an appropriate polymerization solvent, thereby enabling the synthesis.

Examples of the polymerization initiator include 2,2'-azobisisobutyronitrile, 2,2'-azobis(4-methoxy-2,4-dimethylvaleronitrile), 2,2'-azobis(2-cyclopropylpropionitrile), 2,2'-azobis(2,4-dimethylvaleronitrile), 2,2'-azobis(2-methylpropionitrile), dimethyl 2,2-azobisisobutyrate, and the like. The polymerization initiator used may be of one type, or a combination of two or more types.

Examples of the polymerization solvent include alkanes such as n-pentane, n-hexane, n-heptane, n-octane, n-nonane and n-decane; cycloalkanes such as cyclohexane, cycloheptane, cyclooctane, decaphosphorus and norbornane; aromatic hydrocarbons such as benzene, toluene, xylene, ethylbenzene and cumene; chlorobutanes; bromohexanes; dichloroethanes; halogenated hydrocarbons such as hexamethylenedibromide and chlorobenzene; saturated carboxylate esters such as ethyl acetate, n-butyl acetate, i-butyl acetate and methyl propionate; ethers such as tetrahydrofuran, dimethoxyethane and diethoxyethane; alcohols such as methanol, ethanol, 1-propanol, 2-propanol, 1-butanol, 2-butanol, isobutyl alcohol, 1-pentanol, 3-pentanol, 4-methyl-2-pentanol, o-chlorophenol and 2-(1-methylpropyl)phenol; ketones such as acetone, 2-butanone, 3-methyl-2-butanone, 4-methyl-2-pentanone, 2-heptanone, cyclopentanone, cyclohexanone and methylcyclohexanone, and the like. The polymerization solvent used may be of one type, or a combination of two or more types.

Each polymer obtained by the polymerization reaction is recovered preferably by a reprecipitation technique. More specifically, after completing the polymerization reaction, the polymerization liquid is charged in a reprecipitation solvent, and the intended polymer is recovered in the form of powder. As the reprecipitation solvent, an alcohol, an alkane or the like may be used either alone or in combination of two or more thereof. Apart from the reprecipitation method, liquid-separation operation as well as column operation, ultrafiltration operation or the like may be employed to remove low molecular components, whereby each polymer may be recovered.

The reaction temperature and the reaction time of these synthesis methods may be determined ad libitum depending on the monomer that provides each structural unit, the type of the polymerization initiator employed, and the like.

The weight average molecular weight (Mw) of each polymer in terms of polystyrene on gel permeation chromatography (GPC) is usually 1,000 to 500,000, preferably 1,000 to 100,000, and more preferably 1,000 to 50,000. When the Mw is less than 1,000, the heat resistance of the composition may deteriorate. Whereas, the Mw being greater than 500,000 may lead to deterioration of the adhesiveness of the organic film laminated. In addition, Mw/Mn, a ratio of Mw with respect to the number average molecular weight (Mn) in terms of polystyrene on GPC is preferably 1 to 5, and more preferably 1 to 3.

The Mw and Mn as referred to herein are measured by GPC using GPC columns manufactured by Tosoh Corporation (G2000HXL×2, G3000HXL×1, and G4000HXL×1) under the analytical conditions including a flow rate of 1.0 mL/min, an elution solvent of tetrahydrofuran and a column temperature of 40° C., with mono-dispersed polystyrene as a standard.

The proportion of the low molecular weight components having a molecular weight of less than 1,000 remaining in each polymer is preferably no greater than 0.1% by mass in terms of the solid content with respect to the entirety of each polymer. The proportion of the low molecular weight components herein is measured using a column manufactured by GL Sciences, Inc., (Intersil ODS-25 μm column, 4.6 mmφ× 250 mm) under the analytical conditions including a flow rate of 1.0 mL/min and an elution solvent of acrylonitrile/ 0.1% aqueous phosphoric acid solution, with high performance liquid chromatography (HPLC).

<Method of Preparation of Composition>

The composition may be prepared by mixing specified amounts of the polymer (A), the compound component (B), the polymer (D) and the other components while adjusting the amount of the solvent (C) used such that the concentration of the solid content becomes no less than 2% by mass and no greater than 70% by mass.

<Method for Producing Substrate Having Organic Film Laminated on the Top Face Side Thereof>

In a typically exemplified method for producing a substrate having an organic film laminated on the top face side thereof, the aforementioned composition is applied on, for example, a silicon wafer, which is subjected to a heat treatment, thereby laminating an organic film. With respect application of the composition, for example, a spin coating method, a roll coating method, a dip coating method, or the like may be employed. In addition, the heat treatment may be carried out once, or twice or more times stepwise. The heating temperature is usually 50° C. to 250° C., and preferably 100° C. to 200° C. The heating time is usually 30 sec to 300 sec, and preferably 60 sec to 180 sec. The film thickness of the organic film is preferably 30 nm to 500 nm.

<Composition for Cleaning Immersion Liquid>

A composition for cleaning an immersion liquid of the embodiment of the present invention contains the polymer (A), the compound component (B) and the solvent (C), in which the compound component (B) includes at least one compound selected from the set consisting of the compound (I) having at least two groups represented by the above formula (1), the compound (II) having the group represented by the above formula (2) and the compound (III) having the group represented by the above formula (3).

The composition for cleaning an immersion liquid may be used in a method for cleaning readily and efficiently an immersion liquid containing contaminants immixed in the course of a formation process of a resist pattern carried out using a liquid immersion lithography process to permit reuse of the same, and the composition can be suitably used in, for example, the cleaning method of an immersion liquid of the present invention. According to the composition for cleaning an immersion liquid of the embodiment of the present invention, since in addition to the polymer (A), the solvent (C), the compound component (B) is contained, a rigid organic film can be formed by way of a crosslinking reaction between the compound component (B) and a crosslinkable group in, for example, a method of forming an organic film and cleaning the immersion liquid with the composition for cleaning the immersion liquid.

It is to be noted that the composition for cleaning an immersion liquid of the embodiment of the present invention is the same as the composition used in forming the above mentioned organic film; therefore, explanation in this section is omitted sine it is detailed in the above relevant section and the like.

<Substrate>

The substrate of the embodiment of the present invention has a laminated organic film formed from the composition for cleaning an immersion liquid. This substrate has a rigid organic film due to a crosslinking reaction between the compound component (B) and a crosslinkable group when the aforementioned particular composition for cleaning an immersion liquid is used. As a result, the substrate can be suitably used as, for example, a substrate used in the cleaning method of the immersion liquid.

It is to be noted that the substrate of the embodiment of the present invention is the same as the substrate explained in connection with the aforementioned cleaning method of an immersion liquid; therefore, explanation in this section is omitted sine it is detailed in the above relevant section and the like.

EXAMPLES

Hereinafter, the present invention is explained more specifically by way of Examples, but the present invention is not limited to these Examples.

<Synthesis of Each Polymer>

Using monomers represented by the following formulae (M-1) to (M-7), respectively, each polymer was synthesized.

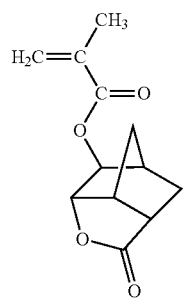

(M-1)

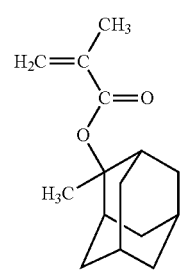

(M-2)

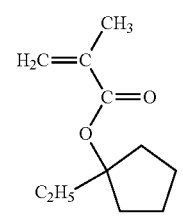

(M-3)

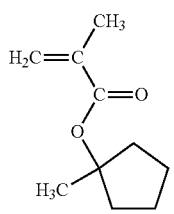

(M-4)

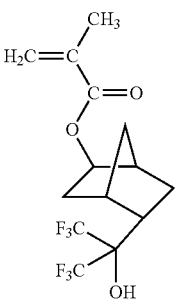

(M-5)

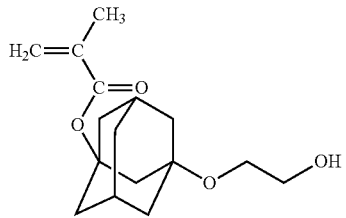

(M-6)

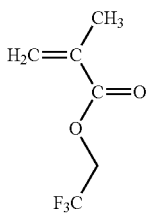

(M-7)

<Synthesis of Polymer (A)>

[Synthesis Example 1] Synthesis of (A-1)

Into a flask were charged 50.4 g (50% by mole) of (M-1), 37.2 g (35% by mole) of (M-2) and 12.4 g (15% by mole) of (M-3) as monomers, 4.03 g of 2,2'-azobisisobutyronitrile as a polymerization initiator, and 200 g of 2-butanone as a polymerization solvent, and a polymerization reaction was allowed by stirring under nitrogen at 80° C. for 6 hours. After completing the polymerization reaction, the polymerize solution was cooled with water to 30° C. or below, and then the mixture was charged into 200 g of methanol. The powder thus deposited was filtered off. The powder obtained by filtration was washed twice with 400 g of methanol, and again filtered off, followed by drying at 50° C. for 17 hours to obtain a polymer (A-1) (yield: 75 g; yield percentage: 75%). This polymer had a Mw of 6,900, and the Mw/Mn was 1.4. As a result of a $^{13}$C-NMR analysis, the contents of structural units derived from (M-1), (M-2) and (M-3) were 50.9% by mole, 34.6% by mole and 14.5% by mole, respectively. Note that herein the $^{13}$C-NMR analysis carried out for determining the content (% by mole) of each structural unit in the polymer used a nuclear magnetic resonance apparatus (JNM-EX270, manufactured by JEOL, Ltd.).

[Synthesis Example 2] Synthesis of (A-2)

A polymer (A-2) was obtained (yield: 80 g; yield percentage: 80%) by a similar operation to Synthesis Example 1 except that 40.17 g (40% by mole) of (M-1), 37.06 g (45% by mole) of (M-4) and 22.77 g (15% by mole) of (M-5) were charged as monomers. This polymer had a Mw of 6,100, and the Mw/Mn was 1.4. As a result of the $^{13}$C-NMR analysis, the contents of structural units derived from (M-1), (M-4) and (M-5) were 40.0% by mole, 45.0% by mole and 15.0% by mole, respectively.

[Synthesis Example 3] Synthesis of (A-3)

A polymer (A-3) was obtained (yield: 78 g; yield percentage: 78%) by a similar operation to Synthesis Example 1 except that 41.49 g (40% by mole) of (M-1), 21.87 g (20% by mole) of (M-2), 23.55 g (30% by mole) of (M-4) and 13.08 g (10% by mole) of (M-6) were charged as monomers. This polymer had a Mw of 9,000, and the Mw/Mn was 1.3. As a result of the $^{13}$C-NMR analysis, the contents of structural units derived from (M-1), (M-2), (M-4) and (M-6) were 42.0% by mole, 20.5% by mole, 28.0% by mole and 9.5% by mole, respectively.

<Synthesis of Polymer (D)>

[Synthesis Example 4] Synthesis of (D-1)

A polymer (D-1) was obtained (yield: 81 g; yield percentage: 81%) by a similar operation to Synthesis Example 1 except that 68.01 g (70% by mole) of (M-3) and 31.99 g (30% by mole) of (M-7) were charged as monomers. This polymer had a Mw of 7,500, and the Mw/Mn was 1.3. As a result of the $^{13}$C-NMR analysis, the contents of structural units derived from (M-3) and (M-7) were 70.0% by mole and 30.0% by mole, respectively.

<Preparation of Composition>

Using each polymer thus synthesized, and the compound component (B), the solvent (C), the acid generator (E) and the acid diffusion controlling agent (F) described below, each composition was prepared according to the type and the amount used of each component shown in Table 1. In Table 1, the designation "-" in the column indicates that the component was not contained.

(B) Compound component

B-1: trade name "Nikalac MX-750" (manufactured by Nippon Carbide Industries Co., Inc.)

B-2: pentaerythritol tetraacrylate

B-3: trade name "OXIPA" (manufactured by Ube Industries, Ltd.)

B-4: pentaerythritol triacrylate (C) Solvent

C-1: propylene glycol monomethyl ether acetate

C-2: cyclohexanone (E) Acid Generator

E-1: 4-cyclohexylphenyl-diphenylsulfoniumnonafluoro-n-butanesulfonate

E-2: triphenylsulfoniumnonafluoro-n-butanesulfonate

E-3: triphenylsulfonium 2-(bicyclo[2.2.1]heptane-2-yl)-1,1-difluoroethanesulfonate (F) Acid Diffusion Controlling Agent F-1: (R)-(+)-1-(t-butoxycarbonyl)-2-pyrrolidinemethanol N-t-butoxycarbonylpyrrolidine F-2: triphenylsulfonium salicylate

TABLE 1

| Composition | (A) Polymer Type | (A) Polymer Amount used (parts by mass) | (B) Compound component Type | (B) Compound component Amount used (parts by mass) | (C) Solvent Type | (C) Solvent Amount used (parts by mass) | (D) Polymer Type | (D) Polymer Amount used (parts by mass) | (E) acid generator Type | (E) acid generator Amount used (parts by mass) | (F) Acid diffusion controlling agent Type | (F) Acid diffusion controlling agent Amount used (parts by mass) |
|---|---|---|---|---|---|---|---|---|---|---|---|---|
| Composition (1) | A-1 | 100 | B-1 | 20 | C-1<br>C-2 | 1,015<br>435 | D-1 | 3 | E-1<br>E-2 | 6<br>1 | F-1 | 0.5 |
| Composition (2) | A-2 | 100 | B-1<br>B-4 | 10<br>30 | C-1<br>C-2 | 1,015<br>435 | D-1 | 3 | E-2 | 7 | F-1 | 0.5 |
| Composition (3) | A-3 | 100 | B-1<br>B-3 | 10<br>30 | C-1<br>C-2 | 1,015<br>435 | D-1 | 3 | — | — | — | — |
| Composition (4) | A-1 | 100 | B-1<br>B-2 | 10<br>30 | C-1<br>C-2 | 1,015<br>435 | D-1 | 3 | E-1<br>E-2 | 6<br>1 | F-1 | 0.5 |
| Composition (5) | A-3 | 100 | B-1 | 10 | C-1<br>C-2 | 1,015<br>435 | D-1 | 3 | — | — | — | — |
| Composition (6) | A-2 | 100 | B-4 | 30 | C-1<br>C-2 | 1,015<br>435 | — | — | E-1<br>E-3 | 6<br>1 | F-1 | 0.5 |

<Production of Substrate Having Laminated Organic Film>

Each composition was spin coated on a silicon wafer, which was then subjected to a heat treatment under the "First heat treatment" conditions shown in Table 2, followed by a further heat treatment under the "Second heat treatment" conditions show in the same Table to produce a substrate provided with an organic film having a film thickness of 55 nm laminated thereon. The film thickness of the organic film was measured using a film thickness measurement system (Lamda Ace VM-90 (manufactured by Dainippon Screen Mfg. Co., Ltd.).

<Evaluation>

Contaminant removing capability, water repellency and peel resistance were determined, and the results of each determination are shown in Table 2. In Table 2, the designation "-" in the column indicates that the component was not contained, or the heat treatment was not carried out. Also, the substrate of Comparative Example not having an organic film laminated thereon was the same silicon wafer used as the substrate on which an organic film was laminated.

[Contaminant Removing Capability]

After determining the contaminants on the surface of the substrate, a liquid immersion lithography apparatus (NSR S610C, manufactured by NIKON) was used to bring the immersion liquid into contact with exposure lens, and the immersion liquid (ultra pure water) was moved on the substrate as in actual exposure. Then, the immersion liquid was removed and the contaminants on the surface of the substrate were determined again to derive the contaminant removing capability from the results of determination. When the contaminants on the surface of the substrate increased after removing the immersion liquid as compared with the contaminants before supplying the same, the contaminant removing capability was evaluated to be favorable "A" presuming that removal the contaminants which had been included in the immersion liquid was indicated, whereas the contaminant removing capability was evaluated to be inferior "B" when the contaminants on the surface of the substrate decreased after the removal of the immersion liquid, presuming that an increase in the contaminants included in the immersion liquid was indicated. It is to be noted that the contaminants on the surface of the substrate were determined using a Brightfield Patterned Wafer Inspector (KLA2810, manufactured by KLA-Tencor Corporation).

[Water Repellency]

The substrate was mounted in a receding contact angle meter (DSA-10, manufactured by KRUS), and water was charged on the substrate from a needle to form 20 μL of a water droplet. After the needle was drawn out from the water droplet once, the needle was inserted into the water droplet again. Thus, the receding contact angle was measured at a frequency once per minute while aspirating the water droplet for 90 seconds at a rate of 10 μL/min with this needle. Then, an average value of the receding contact angle over 20 seconds after stable measurements was given. Evaluation of the water repellency was made based on the average value as: being favorable "A" for no less than 70°, to; being somewhat favorable "B" for less than 70° and no less than 65°; and being inferior "C" for less than 65°.

[Peel Resistance]

With respect to the substrate on which the organic film had been laminated, peeling of the organic film was also observed when the contaminants on the surface of the substrate were determined after removing the immersion liquid in the evaluation of the contaminant removing capability. Evaluation of the peel resistance was made based on the results of this observation. In this test, when peeling of the organic film was not observed, the peel resistance was evaluated to be favorable "A"; whereas when the peeling was observed, the peel resistance was evaluated to be inferior "B".

TABLE 2

| | Composition used in the cleaning method | First heat treatment | | Second heat treatment | | Contaminant removing capability | Water repellency | Peel resistance |
|---|---|---|---|---|---|---|---|---|
| | | Heating temperature (° C.) | Heating time (sec) | Heating temperature (° C.) | Heating time (sec) | | | |
| Example 1 | Composition (1) | 115 | 60 | 180 | 60 | A | A | A |
| Example 2 | Composition (2) | 120 | 60 | 175 | 60 | A | A | A |
| Example 3 | Composition (3) | 120 | 60 | 155 | 60 | A | A | A |
| Example 4 | Composition (4) | 100 | 60 | 180 | 60 | A | A | A |
| Example 5 | Composition (5) | 115 | 60 | 170 | 60 | A | A | A |
| Example 6 | Composition (3) | 115 | 60 | 180 | 60 | A | A | A |
| Example 7 | Composition (5) | 115 | 60 | 190 | 60 | A | A | A |
| Example 8 | Composition (1) | 120 | 60 | 170 | 60 | A | A | A |
| Example 9 | Composition (2) | 120 | 60 | 160 | 60 | A | A | A |
| Example 10 | Composition (5) | 120 | 60 | 150 | 60 | A | A | A |
| Example 11 | Composition (6) | 120 | 60 | 120 | 60 | A | B | A |
| Comparative Example 1 | — | — | — | — | — | B | — | — |

As is seen from the results shown in Table 2, Comparative Example in which the substrate does not have an organic film laminated thereon exhibited inferior contaminant removing capability, whereas all Examples in which the substrate had an organic film was laminated thereon exhibited favorable contaminant removing capability.

According to the cleaning method of an immersion liquid, the composition for cleaning an immersion liquid and the substrate of the embodiment of the present invention, the immersion liquid containing contaminants immixed in the course of a formation process of a resist pattern carried out using a liquid immersion lithography process can be readily and efficiently cleaned, thereby permitting reuse of the same. Therefore, the cleaning method of an immersion liquid of the embodiment of the present invention can be suitably applied to processes of manufacturing semiconductor devices capable of forming finer resist patterns with superior resolving ability.

Obviously, numerous modifications and variations of the present invention are possible in light of the above teachings. It is therefore to be understood that within the scope of the appended claims, the invention may be practiced otherwise than as specifically described herein.

The invention claimed is:

1. A cleaning substrate comprising:
   a substrate; and
   an organic film provided on a surface of the substrate and being made from an immersion liquid cleaning composition,
   wherein the immersion liquid cleaning composition comprises:
   a first polymer;
   a second polymer comprising at least one fluorine atom, an amount of the second polymer being no less than 0.1 parts by mass and no greater than 20 parts by mass with respect to 100 parts by mass of the first polymer;
   a compound component; and
   a solvent,
   wherein the immersion liquid cleaning composition does not comprise an acid generator, wherein the compound component comprises at least one compound selected from the group consisting of pentaerythritol tetraacrylate, pentaerythritol triacrylate, a compound represented by formula (A), and a compound represented by formula (B):

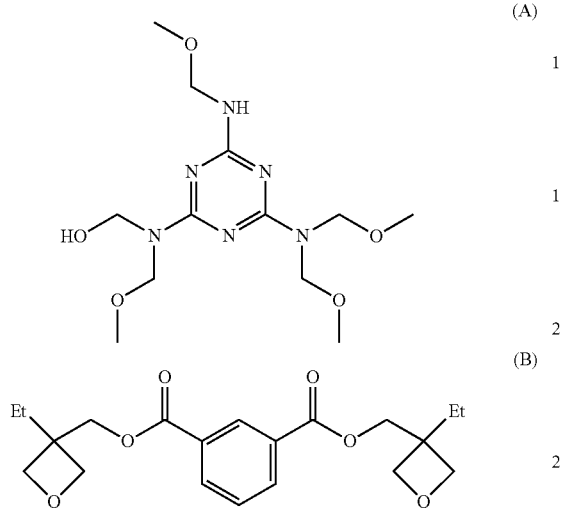

wherein Et is an ethyl group.

2. The cleaning substrate of claim 1, wherein the compound component comprises of at least two compounds selected from the group consisting of pentaerythritol tetraacrylate, pentaerythritol triacrylate, the compound represented by formula (A), and the compound represented by formula (B).

3. The cleaning substrate of claim 1, wherein the first polymer comprises a first structural unit represented by formula (4),

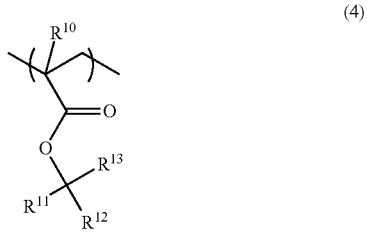

wherein, in the formula (4),
$R^{10}$ represents a hydrogen atom, a methyl group or a trifluoromethyl group, and
each of $R^{11}$, $R^{12}$ and $R^{13}$ independently represents an alkyl group having 1 to 20 carbon atoms or a monovalent alicyclic hydrocarbon group having 3 to 20 carbon atoms, and, optionally, $R^{11}$ and $R^{12}$ bind with each other to form a ring structure together with the carbon atom to which $R^{11}$ and $R^{12}$ each bind, wherein all of hydrogen atoms of each of $R^{11}$, $R^{12}$ and $R^{13}$ are unsubstituted or at least a part of hydrogen atoms of each of $R^{11}$, $R^{12}$ and $R^{13}$ are substituted.

4. The cleaning substrate of claim 1, wherein the second polymer comprises a structural unit represented by formula (5), a structural unit represented by formula (6) or a combination thereof,

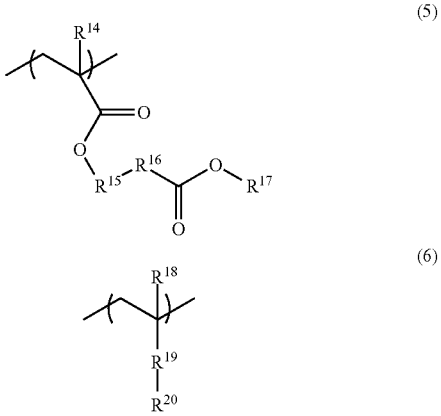

wherein, in the formula (5),
$R^{14}$ represents a hydrogen atom, a methyl group or a trifluoromethyl group,
$R^{15}$ represents a single bond, a methylene group, an alkylene group having 2 to 20 carbon atoms, a bivalent alicyclic hydrocarbon group having 3 to 20 carbon atoms, a bivalent aromatic hydrocarbon group having 6 to 20 carbon atoms, or a bivalent group combined thereof, wherein all of hydrogen atoms of $R^{15}$ are unsubstituted or at least a part of hydrogen atoms of e are substituted,
$R^{16}$ represents a fluorinated methylene group or a fluorinate alkylene group having 2 to 20 carbon atoms, and
$R^{17}$ represents a hydrogen atom or a monovalent organic group,
wherein in the formula (6),
$R^{18}$ represents a hydrogen atom, a methyl group or a trifluoromethyl group,
$R^{19}$ represents a bivalent linking group, and
$R^{20}$ represents a fluorinated alkyl group having 1 to 20 carbon atoms or a monovalent fluorinated alicyclic hydrocarbon group having 3 to 20 carbon atoms.

5. The cleaning substrate of claim 1, wherein a content of the compound component is no less than 1 part by mass and no greater than 100 parts by mass with respect to 100 parts by mass of the first polymer.

6. The cleaning substrate of claim 1, wherein a content of the compound component is no less than 1 part by mass and no greater than 50 parts by mass with respect to 100 parts by mass of the first polymer.

7. The cleaning substrate of claim 1, wherein the solvent comprises ketone, propylene glycol monoalkyl ether acetate, 2-hydroxypropionic acid alkyl, 3-alkoxypropionic acid alkyl, y-butyrolactone, or a mixture thereof.

8. The cleaning substrate of claim 1, wherein the compound component comprises the compound represented by formula (A) and the compound represented by formula (B).

9. The cleaning substrate of claim 1, wherein the compound component comprises the compound represented by formula (A), and optionally the compound represented by formula (B).

10. The cleaning substrate of claim 1, wherein the compound component comprises the compound represented by formula (A) and at least one compound selected from the group consisting of pentaerythritol tetraacrylate, pentaerythritol triacrylate, and the compound represented by formula (B).

11. The cleaning substrate of claim 1, wherein the compound component comprises pentaerythritol triacrylate.

12. The cleaning substrate of claim 1, wherein the immersion liquid cleaning composition further comprises a surfactant.

13. The cleaning substrate of claim 1, wherein the solvent comprises ketone, propylene glycol monoalkyl ether acetate or a mixture thereof.

14. The cleaning substrate of claim 1, wherein the solvent comprises propylene glycol monomethyl ether acetate, cyclohexanone, or a mixture thereof.

* * * * *